(12) United States Patent
Richter et al.

(10) Patent No.: US 11,093,042 B2
(45) Date of Patent: Aug. 17, 2021

(54) SYSTEM FOR INTERACTING WITH OBJECTS USING GESTURES IN AN ENVIRONMENT

(71) Applicants: Wolfgang Richter, Vancouver (CA); Faranak Zadeh, Vancouver (CA)

(72) Inventors: Wolfgang Richter, Vancouver (CA); Faranak Zadeh, Vancouver (CA)

(73) Assignee: EPIC SEMICONDUCTORS INC

( * ) Notice: Subject to any disclaimer, the term of this patent is extended or adjusted under 35 U.S.C. 154(b) by 110 days.

(21) Appl. No.: 16/284,598

(22) Filed: Feb. 25, 2019

(65) Prior Publication Data
US 2019/0391663 A1    Dec. 26, 2019

Related U.S. Application Data

(60) Provisional application No. 62/635,060, filed on Feb. 26, 2018.

(51) Int. Cl.
| | |
|---|---|
| *G06F 3/044* | (2006.01) |
| *H03K 17/955* | (2006.01) |
| *G06F 3/01* | (2006.01) |
| *G06F 3/041* | (2006.01) |

(52) U.S. Cl.
CPC .............. *G06F 3/017* (2013.01); *G06F 3/044* (2013.01); *G06F 3/04164* (2019.05); *H03K 17/955* (2013.01)

(58) Field of Classification Search
CPC ...... G06F 3/017; G06F 3/04164; G06F 3/044; G06F 3/04182; G06F 3/04162; G06F 3/0442; H03K 17/955; H03K 2217/94036; B60K 2370/1464; B60K 37/06; B60K 35/00
See application file for complete search history.

(56) References Cited

U.S. PATENT DOCUMENTS

| | | | |
|---|---|---|---|
| 9,509,178 B2* | 11/2016 | Richter | .................. H02J 50/05 |
| 10,162,415 B2* | 12/2018 | Richter | .................. G06F 3/015 |
| 10,489,342 B2* | 11/2019 | Richter | .................. G06F 15/76 |
| 2021/0000348 A1* | 1/2021 | Richter | ................ A61B 5/1102 |

* cited by examiner

*Primary Examiner* — Temesghen Ghebretinsae
*Assistant Examiner* — Karin Kiyabu

(57) ABSTRACT

Disclosed is a system for allowing users to capacitively interact with objects using gestures in an environment. The system includes a smart sense unit for communicating gesture information and a smart sensing master unit is capacitively coupled to the smart sense unit for identifying the received gesture information and identification information from the smart sense unit to operate the object. The gestures may either be 2D, 3D, multiple 2D or 3D gestures from different users or different body parts. The smart sense unit identifies the change in a provided electric field caused by the user and the object and converts into a digital value. The smart sense unit further identifies the location of the object and the user and further communicates the information to the smart sensing master unit. The smart sensing master unit identifies the gesture and the identification information to interact with the object on receiving the impedance changes forked out from a resonator.

17 Claims, 7 Drawing Sheets

SYSTEM FOR INTERACTING WITH OBJECTS USING GESTURES IN AN ENVIRONMENT

CROSS-REFERENCE TO RELATED APPLICATION

The present application claims benefit of priority from U.S. Provisional Application No. 62/635,060, filed Feb. 26, 2018, which is incorporated herein by reference in its entirety.

BACKGROUND OF THE INVENTION

1. Field of the Invention

The present invention generally relates to gesture recognition, and more particularly relates a system for interacting with objects using gestures in an environment.

2. Description of Related Art

The modern technology offers many ways of interactivity with computers and/or machines. The interaction with machines started with button and switches, which have the disadvantage that they somehow need to be connected with electronic circuits usually over wires and connectors. The position of buttons was fixed because the wires had been routed over distance and through holes.

Smart devices offered touch functions to replace button and to made their positioning more flexible e.g. on a screen (LCD, OLED, Plasma, etc). The tactile impression was also simulated due vibrations. This kind of technology evolved from single touch with one finger to multi-touch, 2D gesture where fingers slide over interactive reactive surfaces (2D gesture recognition, in which specific pattern from the user could be interpreted to launch functions).

Advances in mobile devices have allowed rendering web pages just like an ordinary browser. Users can navigate a large page with ease, despite the device's constraint size using a set of simple and intuitive gestures. They can drag and flick a large page to position it within the display view port, pinch the display to zoom in and out of the viewed page or tap on page elements to center and scale the page to fit the view port.

The state of the art now is 3D gesture, where users do not have to touch the touch screen, instead they may do single hand movements nearby which are recognized and interpreted, often by artificial intelligence or similar algorithms (neural networks etc.). New technology has been developed to allow controlling of your tablet from across the room using 3D gestures, such as a swirl or swipe of the hand.

These technology employs usage of cameras or projector, computers and algorithms for face-pattern detection to identify gestures. Existing technologies become more and more complicated and often need the help of remote data centers to cope with the amount of data to be analyzed.

Till now users are never identified during the action. Instead, the identification was taken over by camera systems, computers, and algorithms for face-pattern detection. To recognize more than one user on the same or on different devices inside an environment (home, car, shop etc) existing technologies become more and more complicated.

Therefore, there is a need of a system for interacting with objects using gestures in an electric field environment. The system should be able to allow multiple users to interact with machines and/or computer devices dividing users action into approach, gesture or touch of a specific area in reach. Furthermore, the system should be wireless, in many aspects contactless and self-powered to avoid the use of batteries and further should be able to integrate into existing items like cars, rooms, appliances as well as clothing and accessories.

SUMMARY OF THE INVENTION

In accordance with teachings of the present invention, a system for interacting with objects using gestures in an environment is provided.

An object of the present invention is to provide a system for allowing users to capacitively interact with objects using gestures in an environment. The system includes a smart sense unit and a smart sensing master unit. The smart sense unit communicates gesture information received from the user. The smart sense unit sends identification information related to either the user or the object. The smart sensing master unit is capacitively coupled to the smart sense unit for identifying the received gesture information and the identification information to operate the object.

The smart sensing master unit includes a generator, a resonator, a first emitting conductive surface, a controller, and an interface. The smart sense unit includes a mirror electrode, a rectifier, a buffer, a Schmitt trigger, a data separator unit, a counter, an impedance sensing sub-circuit, a memory unit, an identification unit, a digital comparator, a serial modulator, an electronic switch and a floating electrode.

The smart sense unit detects the presence, body movements and location of the user approaching to operate the object. The smart sense unit identifies changes in electric field and the smart sensing master unit measures the change in the electric field. The smart sensing master unit allows the user to operate the object using desired multiple gestures.

The alternating electric field emits a signal for synchronization, which resets counters in all smart sense units in reach. When the counters, clocked by data separator unit, reach a value which matches the unique ID, a timeslot is opened for the smart sense units to receive and transmit the unique ID and/or sensing data (or other values) to the smart sensing master unit. As timeslots never overlap, a collision free communication is achieved.

An another object of the present invention is to provide the system with a baseliner and a percenter. The baseliner stores a baseline value to compare the digital value received from the impedance sensing sub-circuit. The baseliner adjusts the values and migrates to the value in the memory unit to compensate drift and ignore obstacles.

The percenter normalize the digital values received from the impedance sensing sub-circuit into a percentage from a given maximum or minimum value for self-calibrating. The smart sense unit includes a normalized baseliner and a digital comparator, which computes the difference between the baseline value and currently measured e-field strength.

The result appears in percentage which is transmitted to the controller to be further processed and communicated via the interface. The result also shows the difference as a trend (−1, 0, +1), which is further added to the baseline in certain time steps. Therefore, the baseline value migrates towards the impedance sensing sub-circuit until their values are equal.

Another object of the present invention is to provide the smart sense unit with a feedback device to generate feedback signals on receiving command from the controller via the data separator unit. The smart sense unit further includes a switch matrix to operate the feedback unit.

These and other features, aspects and advantages of the present invention will become better understood with reference to the following drawings, description and claims.

DETAILED DESCRIPTION OF DRAWINGS

Figure 1:
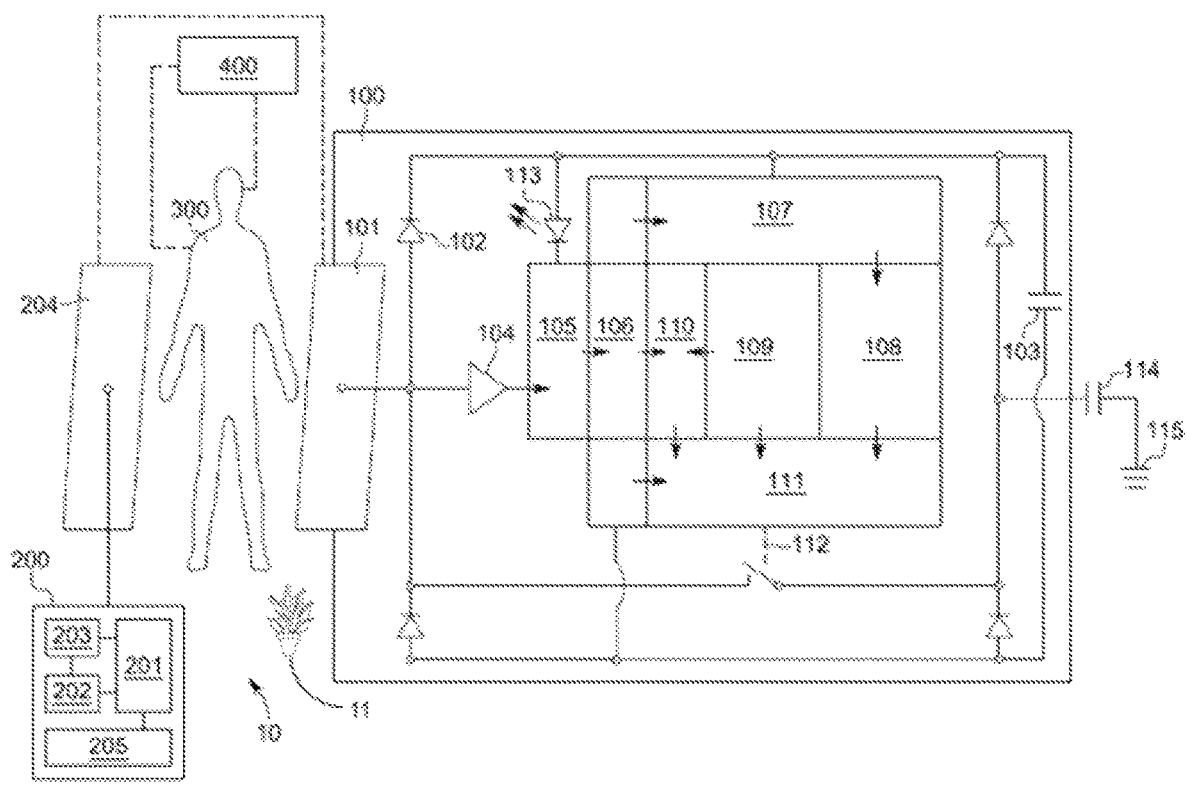
FIG. 1 illustrates a schematic diagram of a system for allowing users to capacitively interact with objects using gestures in an environment in accordance with a preferred embodiment of the present invention.

While this technology is illustrated and described in a preferred embodiment of a system for allowing users to capacitively interact with objects using gestures in an environment that may be produced in many different configurations, forms and materials. There is depicted in the drawings, and will herein be described in detail, as a preferred embodiment of the invention, with the understanding that the present disclosure is to be considered as an exemplification of the principles of the invention and the associated functional specifications for its construction and is not intended to limit the invention to the embodiment illustrated. Those skilled in the art will envision many other possible variations within the scope of the technology described herein.

FIG. 1 illustrates a schematic diagram of a system 10 for allowing users 300 to capacitively interact with objects 400 by using gestures in an environment. The system 10 includes a smart sense unit 100 and a smart sensing master unit 200. The smart sense unit 100 communicates gesture information received from the user. The smart sense unit 100 sends information related to the user 300 and the object 400.

The smart sensing master unit 200 capacitively coupled to the smart sense unit 100 identifies the received gesture information and the identification information to operate the object 400. The smart sensing master unit 200 includes a generator 202, a resonator 203, a first emitting conductive surface 204, a controller 201 and an interface 205.

The smart sense unit 100 includes a mirror electrode 101, a rectifier 102, a buffer 103, a Schmitt trigger 104, a data separator unit 105, a counter 106, an impedance sensing sub-circuit 107, a memory unit 108, an identification unit 109, a digital comparator 110, a serial modulator 111, an electronic switch 112 and a floating electrode 114.

The generator 202 generates controllable frequency at constant voltage level. The resonator 203 creates sine waves from the controllable frequency. Examples of generator 202 include but not limited to oscillators, PWM, VCO, DAC, gates, and multi-vibrators.

The resonator 203 further increases the voltage level. The resonator 203 filters and forks the gesture and identification information. Examples of the resonator 203 include but not limited to rectifiers, inductor, cascade, diode bridges, transformer, and level shifter. The first emitting conductive surface 204 converts the controllable frequency into an alternating electric field (e-field). Examples of the first emitting conductive surface 204 include but not limited to electrodes, conductive materials or liquids, metals, polymers, crystals etc. Living organisms such as plants 11 may also be used to emit the electric field instead of the first emitting conductive surface.

The first emitting conductive surface 204 emits the sine waves alternating electric field. The controller 201 converts gesture information received from the smart sense unit 100 into functions for interacting with the object 400. The controller 201 controls the smart sense unit 100. The controller 201 identifies the location of the user 300 while interacting with the object 400. Examples of the controller 201 include but not limited to MCU, SOCs, FPGAs, state machines or other logic circuits.

The interface 205 communicates the gesture and identification information to interact with the object 400 over a communication network. Examples of the interface 205 include but not limited to I/O-ports, gates, flip-flops, optocouplers, relays, triacs, IGBTs, and MOSFETs. Examples of the communication network include but not limited to wireless, LAN, Wi-Fi, Bluetooth, NFC etc.

The mirror electrode 101 capacitively couples with the first emitting conductive surface 204 to receive the sine waves alternating electric field. The rectifier 102 converts charges received from the mirror electrode 101 into DC energy. Examples of the rectifier 102 include but not limited to inductor, cascade, diode bridges, AC-DC converter, and level shifter.

The buffer 103 smoothes ripples and stores the DC energy and clamps back against over-voltage utilizing the rectifier 102. Examples of the buffer 103 include but not limited to capacitor, GoldCap, silicon battery, accumulators, pair of printed surface, printed polymers etc.

The Schmitt trigger 104 turns the sine waves received from the mirror electrode 101 into digital usable rectangle signal. The data separator unit 105 extracts clock and modulated data from the rectangle signal. The Schmitt trigger 104 sine waves and rectangle signal are explained in detail in conjunction with FIG. 2 of the present invention. Examples of the data separator unit 105 include but not limited to shift registers, (de-)multiplexes, gate arrangements etc.

The counter 106 is synchronized by the data separator unit 105. Further, the counter 106 creates time slots and clocks. In a preferred embodiment of the present invention, the counter 106 is flip-flop array. The impedance sensing sub-circuit 107 measures changes in the electric field caused by the user 300 and the object 400.

Further, the impedance sensing sub-circuit 107 is activated by a counter event from the counter 106 to convert the measurement result of the change in the electric field into a digital value. Examples of the impedance sensing sub-circuit 107 include but not limited to ADC's, RC pulse generators, slope-threshold counters etc.

The memory unit 108 stores the digital value. Examples of the memory unit 108 include but not limited to flip-flop arrays, registers, NAND storage etc. The identification unit 109 is having an identifier value as a unique ID for reference to identify the location of the object 400 and the user 300. Examples of the unique ID include but not limited to numeric key, alphanumeric key, color key or condition key. Examples of identification unit 109 include but not limited to fuse arrays, EPROM, ROM etc.

The digital comparator unit 110 compares a counting event received from the counter 106 with the unique ID received from the identification unit 109 to release a matching signal on identifying a match between the counting event and the unique ID. Example of the digital comparator unit 110 include but not limited to XOR array, specific gate arrangement, (de-) multiplexer etc.

The serial modulator 111 receives the digital value from the memory unit 108 and the unique ID from the identification unit 109 on receiving the match signal from the digital comparator unit 110. The serial modulator 111 modulates the unique ID and the digital value with the clock derived from the counter 106 to create a data telegram. Examples of the serial modulator 111 include but not limited to shift registers with clocked AND gate output.

The electronic switch 112 (e.g. MOSFET) is connected to the serial modulator 111 to change the impedance of the electric field with the data telegram. The controller 201 identifies the gesture and the identification information to interact with the object on receiving the impedance charges forked by the resonator 203. The floating electrode 114 capacitively couples against ground 115 which creates a closed AC circuit for electric field received over the mirror electrode 101.

In another preferred embodiment of the present invention, the smart sense unit 100 further includes a feedback unit 113 to generate feedback signals on receiving command from the controller via the data separator unit 105. Example of the feedback unit 113 include but not limited to LED, LCD, speakers, vibrators, buzzers etc. The feedback unit 113 generally generates feedback signals related to working of the circuitry or state of the user's action.

Figure 2:
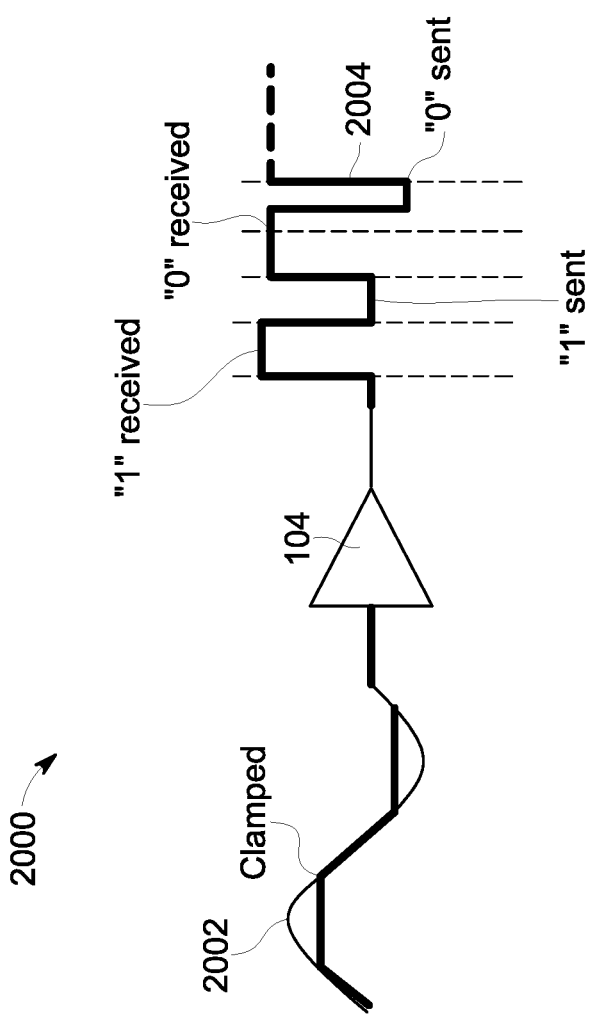
FIG. 2 illustrates a schematic diagram of a timing diagram for an obstacle free interaction with objects in accordance with a preferred embodiment of the present invention.

FIG. 2 illustrates a schematic diagram 2000 of a timing diagram for an obstacle free interaction with objects. The sine waves 2002 are created by the resonator (203, shown in FIG. 1) and the buffer (103, shown in FIG. 1) clamps the sine waves. The Schmitt trigger 104 turns the wave into a digital usable rectangle signal 2004.

For exemplary purposes, a duty cycle of 50%, the data separator (105, shown in FIG. 1) interprets the current period a logic "1" (high), while a duty cycle from more than 75% gets recognized as a logic "0" (low) or vice versa, the negative part of the sine wave is not passing the Schmitt trigger 104 (positive logic), yet still delivers power.

Therefore, this is used to send data back to the smart sensing master unit (200, as shown in FIG. 1), if the electronic switch (112, as shown in FIG. 1) changes the impedance during the negative phase. Thus, the smart sense unit 100 receives and sends data "quasi full duplex" (yet phase shifted) at the e-field frequency (e.g. 250 kHz=250 Kbd). The smart sense unit 100 cyclically repeats sending and receiving data telegrams, bit errors are filtered out by comparing with previous data telegrams.

Following is the exemplary command list of operation codes provided from the master:

| Command (mnemonic) | Meaning |
| --- | --- |
| Sync | resets all smart sensing units in reach |
| Thres Addr Value | Sets one, a group, or all addressed smart sense units to a threshold level (of a change in the impedance, e.g. from a gesture). A smart sense unit only sends data back to the smart sensing master unit, if at least the threshold is reached. This feature is preferably used to interpret multi gestures. |
| Rept Addr | One, a group, or all addressed smart sense units continuously measure the impedance and send the related digital value together with the unique ID to master, synchronized and collision free in their time slots |
| Set Addr Value | switches peripherals (e.g. LEDs) of one, a group, or all addressed use smart sensing units on or off. With a special value (e.g. '?') data from peripherals (e.g. sensors) can be received from the smart sensing master unit. |
| Tid Value | The master can give "guest units type 100" (=smart sensing units temporary in reach*) a temporary ID number. A special time slot (e.g. time slot "zero", direct after a "Sync" command) lets the "guest unit" send its unique ID. The master can register the unit and provide it with a temporary ID number, NOW, another "guest unit" can be accepted. This is useful e.g. to identify parts or tools equipped with the smart sense unit. The use of the part or tool could be monitored, supervised or reported (e.g. in a database, or blockchain etc.) |

Figure 3:
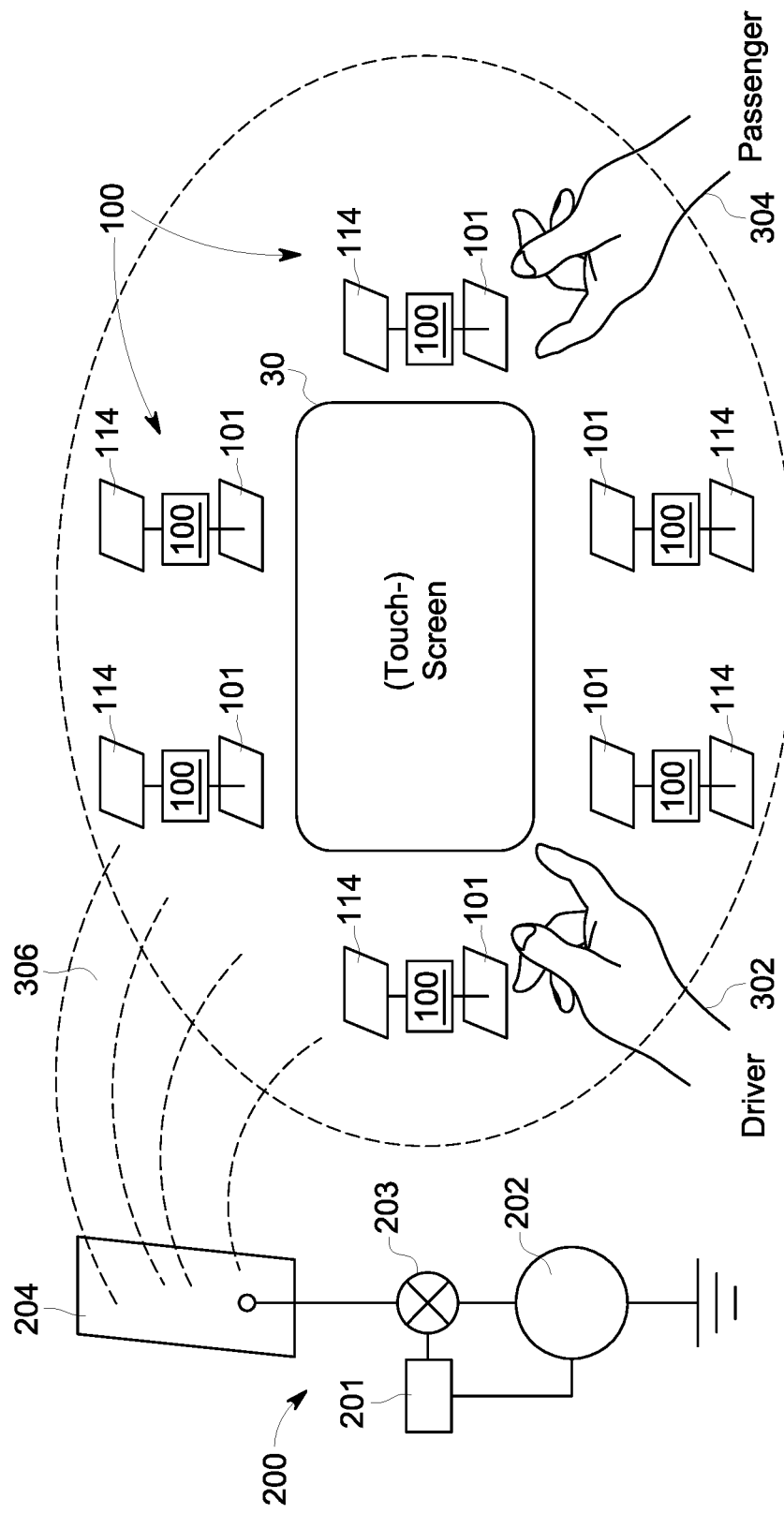
FIG. 3 illustrates a schematic diagram showing plurality of smart sense units placed in proximity of touch screen operated by plurality of users inside a vehicle using multiple 3D gestures in accordance with exemplary embodiment of the present invention.

FIG. 3 illustrates a schematic diagram showing plurality of smart sense units 100 placed in proximity of touch screen 30 operated by plurality of users 302, 304 inside a vehicle using multiple 3D gestures in accordance with exemplary embodiment of the present invention. The smart sense units 100 are able to identify whether the driver 302 or the passenger 304 is operating the touch screen 30.

In exemplary embodiment of the present invention, six smart sense units 100 are placed around the touch screen 30. However, it would be apparently to those skilled in the art that 'n' number of smart sense units 100 may be used together to detect gestures created by multiple users.

The smart sense units 100 identifies the location of approaching user i.e. either the driver 302 or the passenger 304 and capacitively communicate the change in electric field, gesture information and location of approaching user to the smart sensing master unit 200.

The smart sensing master unit 200 detects gesture information and position of approaching user i.e. either the driver 302 or the passenger 304 from the direction they approach to operate the touch screen 30. The smart sensing master unit 200 allows the driver 302 and the passenger 304 to operate the touch screen 30 using desired 3D multiple gestures. The touch screen 30 may be operated for multiple purposes including but not limited to get information, set values, play games, play entertainment content etc.

In another preferred embodiment of the present invention, the smart sensing master unit 200 may be configured to deactivate selected commands (like changing of music channels, watching videos, dialing phone numbers, texting etc.)

from the driver 302 while driving the vehicle. This to ensure that the driver 302 has full concentration on the road while driving. The smart sense master unit 200 inhibits properties of artificial intelligence to always track, analyze, and communicates the hand position of the driver 302 and the passenger 304 to the nearest smart sense unit 100.

In another preferred embodiment of the present invention, a single user i.e. driver 302 approaches the touch screen 30 using both hands. The smart sensing master unit 200 is able to recognize 3D gestures made by the driver 302 with both hands. The nearest smart sense unit 100 identifies the location of the hand and gesture information is transmitted to the smart sensing master unit 200.

Figure 4:
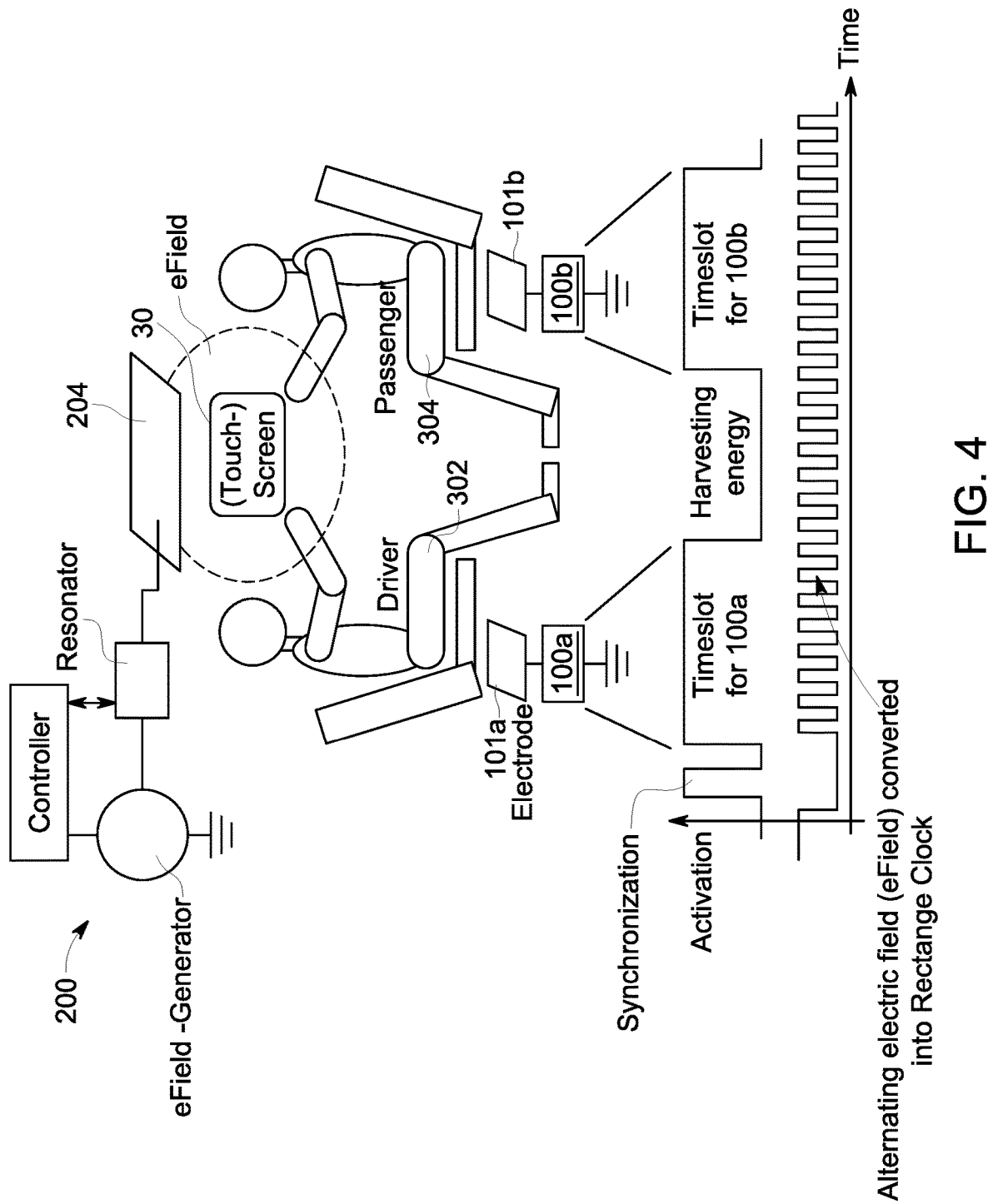
FIG. 4 illustrates a schematic diagram showing smart sense units attached to driver seat and the passenger seat respectively for identifying location and gestures of driver and passenger for operating the touch screen inside a vehicle in accordance with another exemplary embodiment of the present invention.

FIG. 4 illustrates a schematic diagram showing smart sense units 100a and 100b attached to driver seat 402a and the passenger seat 402b respectively for identifying location and gestures of driver and passenger for operating the touch screen 30 inside a vehicle in accordance with another exemplary embodiment of the present invention. The smart sensing master unit 200 is capacitively coupled with the smart sense units 100a, 100b.

The smart sense unit 100a detects the presence and body movements and location of the driver 302 approaching to operate the touch screen 30 and the smart sense unit 100b detects the presence and body movements and location of the passenger 304 approaching to operate the touch screen 30. The gesture information and unique ID from the smart sense units 100a, 100b is communicated to the smart sensing master unit 200.

The alternating electric field emits a signal for synchronization, which resets counters in all smart sense units (100) in reach. When the counters, clocked by data separator unit, reach a value which matches the unique ID, a timeslot is opened for the smart sense units 100a, 100b to receive and transmit the unique ID and/or sensing data (or other values) to the smart sensing master unit 200. As timeslots never overlap, a collision free communication is achieved.

Figure 5:
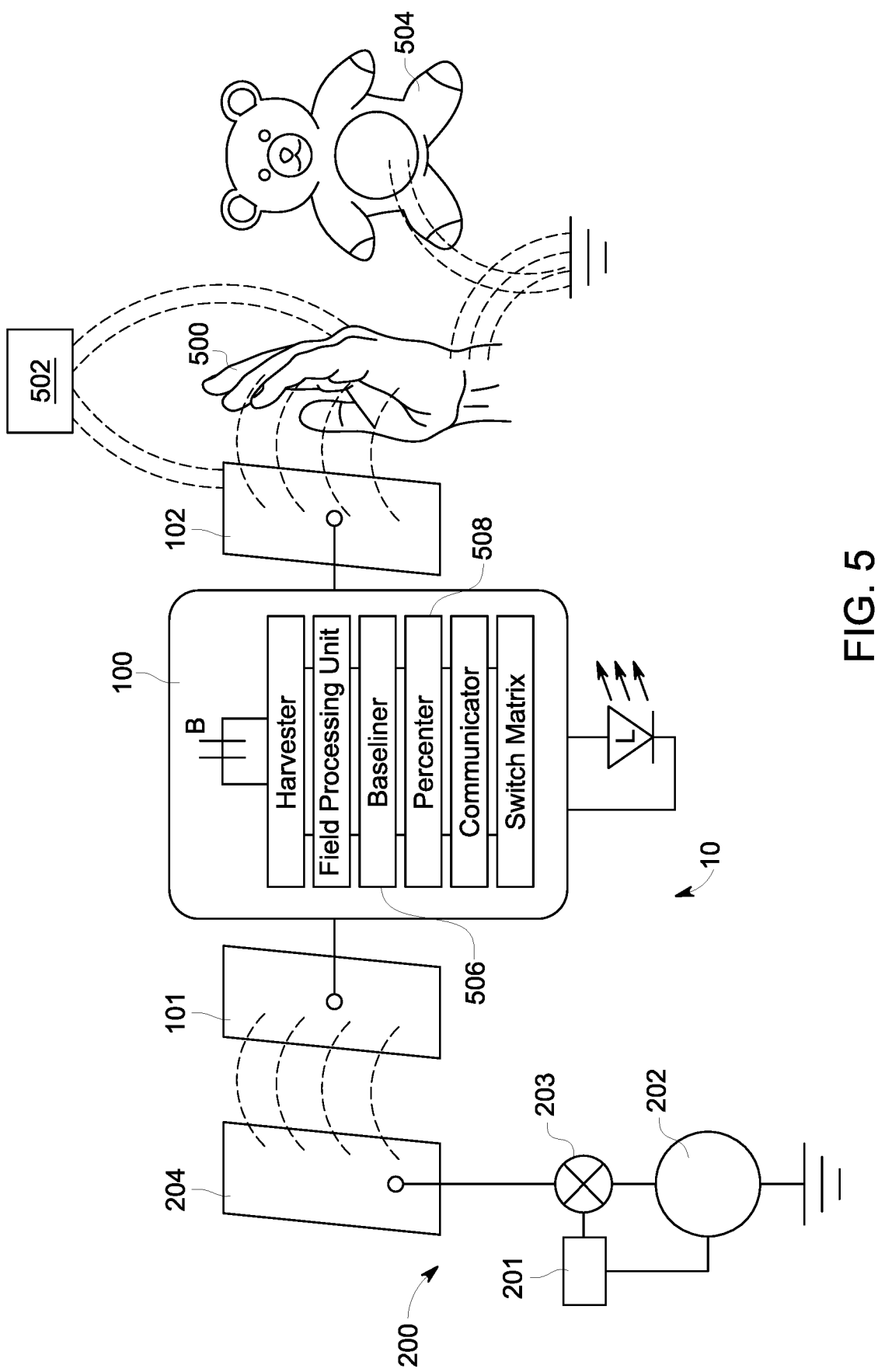
FIG. 5 illustrates a schematic diagram of a system for allowing user to interact with object while compensating drift and ignore obstacles in accordance with another preferred embodiment of the present invention.

FIG. 5 illustrates a schematic diagram of a system 10 for allowing user 500 to interact with object 502 while compensating drift and ignore obstacles 504 in accordance with another preferred embodiment of the present invention. The smart sense unit 100 further includes a baseliner 506 and a percenter 508.

The baseliner 506 stores a baseline value to compare the digital value received from the impedance sensing sub-circuit (107, shown in FIG. 1). The baseliner 506 adjusts the values and migrates (counts) to the value in the memory unit (108, shown in FIG. 1) to compensate drift and ignore obstacles 504.

The percenter 508 normalize the digital values received from the impedance sensing sub-circuit (107, shown in FIG. 1) into a percentage from a given maximum or minimum value for self-calibrating. Examples of the baseliner 508 include but not limited to 16 bit up/down counter, binary counter, D-flip flops etc. Examples of the percenter 508 include but not limited to divider, multiplier, MACs, ALUs etc.

The capacitive system 10 tends to drift and is sensitive to obstacles. In a preferred embodiment smart sense unit 100 contains a normalized baseliner and a digital comparator, which computes the difference between the baseline value and currently measured e-field strength.

The result appears in percentage which is transmitted to the controller 201 to be further processed and communicated via interface (205, shown in FIG. 1). The result also shows the difference as a trend (e.g. −1, 0, +1), which is further added to the baseline in certain time steps. Therefore, the baseline value migrates towards the impedance sensing sub-circuit (107, shown in FIG. 1) until their values are equal.

It is apparent that the e-field changing gestures are quicker than the baseliner 506 updates. Thus, the system 10 allows the user 500 to operate the object 400 using multiple 3D gestures while holding in a hand or if placed in proximity to the obstacle 504. The obstacle 504 either absorb or bridge the provided alternating electric field.

Examples of obstacle 504 include but not limited to human beings, plants, animals, soft toys, toys, pawns, instruments, and any other similar living organism or non-living device etc. The concept of absorbing and bridging the provided electric field is explained in detailed in conjunction with FIG. 6A of the present invention.

For exemplary purposes, the measured e-field strength in a space, and the baseline value is 4096. Now, an obstacle 504 is placed in the space which absorbs a part of e-field and which changes e-filed strength from 4096 to 3000. Therefore, the trend output from the percenter 508 is −1. This trend is now added to the baseline value, which decreases in e.g. 10 seconds to 3000 as the new baseline value. The percenter 508 now has a trend of 0 until a user or obstacle changes the e-field in the space. For quick changes, the baseliner 506 doesn't change. This work similar if the e-field strength drifts due to change in temperature or humidity.

Figure 6A:
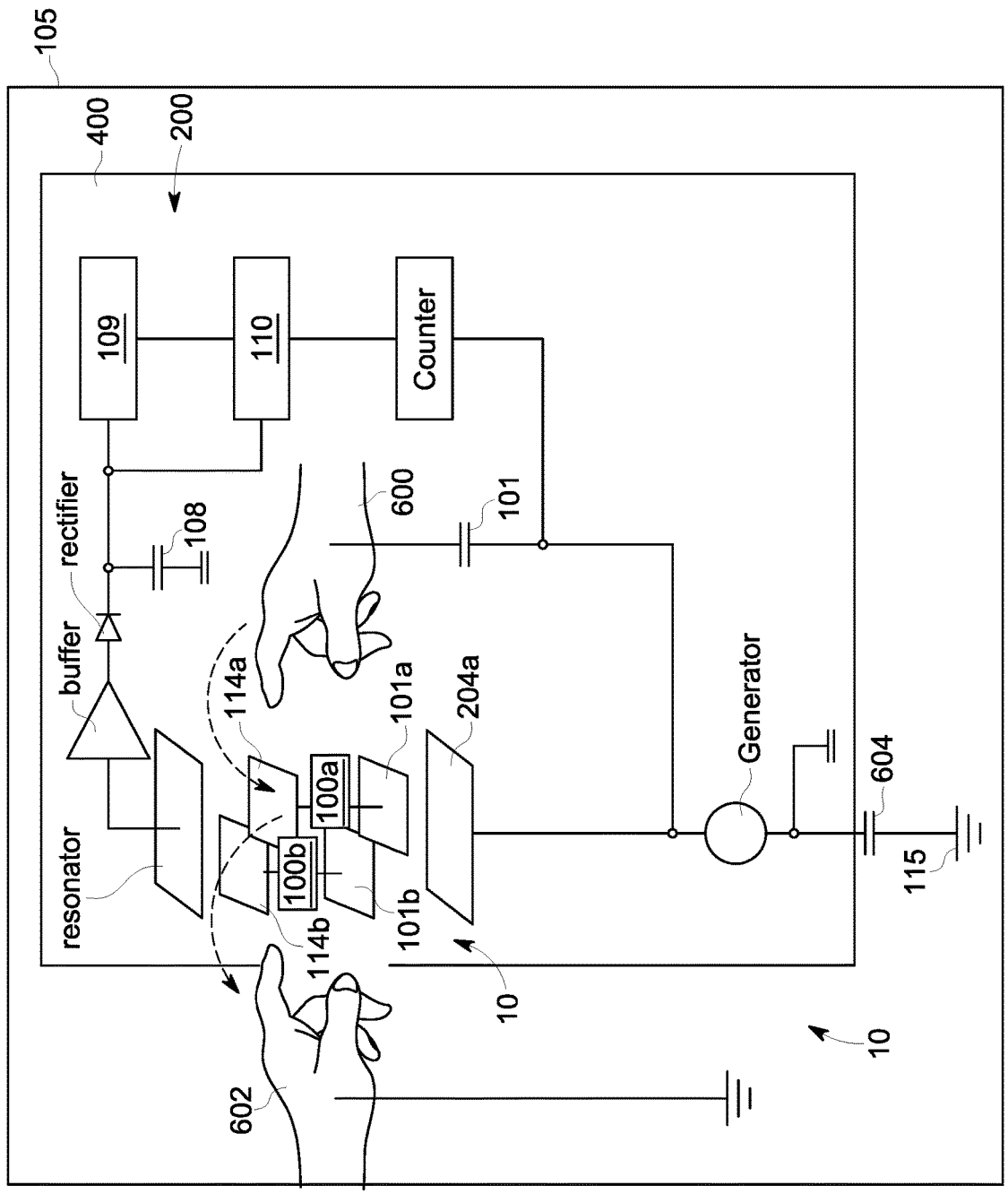
FIG. 6A illustrates a schematic diagram of the system attached to the object operated by a user bridging the electric field in presence of a nearby user absorbing the electric field.

FIG. 6A illustrates a schematic diagram of the system 10 attached to the object 400 operated by a user 600 bridging the electric field in presence of a nearby user 602 absorbing the electric field. The user 600 is in direct contact with the object 400. The smart sense units 100a, 100b identifies presence of the user 602 and communicates the change in impedance to the smart sensing master unit 200.

The user 600 operates the object 400 using multiple 3D gestures. Another user 602 approaches to operate the object 400. The user 602 has no direct contact with the object 400. The user 602 absorbs the electric field and the smart sense unit 100 identifies the gesture from the user 602, while draining the charges through earth's ground 115 on coupling with floating electrode 604.

In a preferred embodiment of the present invention, the object 400 stores digital value of various gestures and the smart sensing master unit (200, shown in FIG. 1) conveys and communicates the identified digital value of the gesture and the identification information to the object 400. The object 400 compares the stored digital value with the received digital value of the gesture and then object 400 is operated as per the command of the gestures.

Figure 6B:
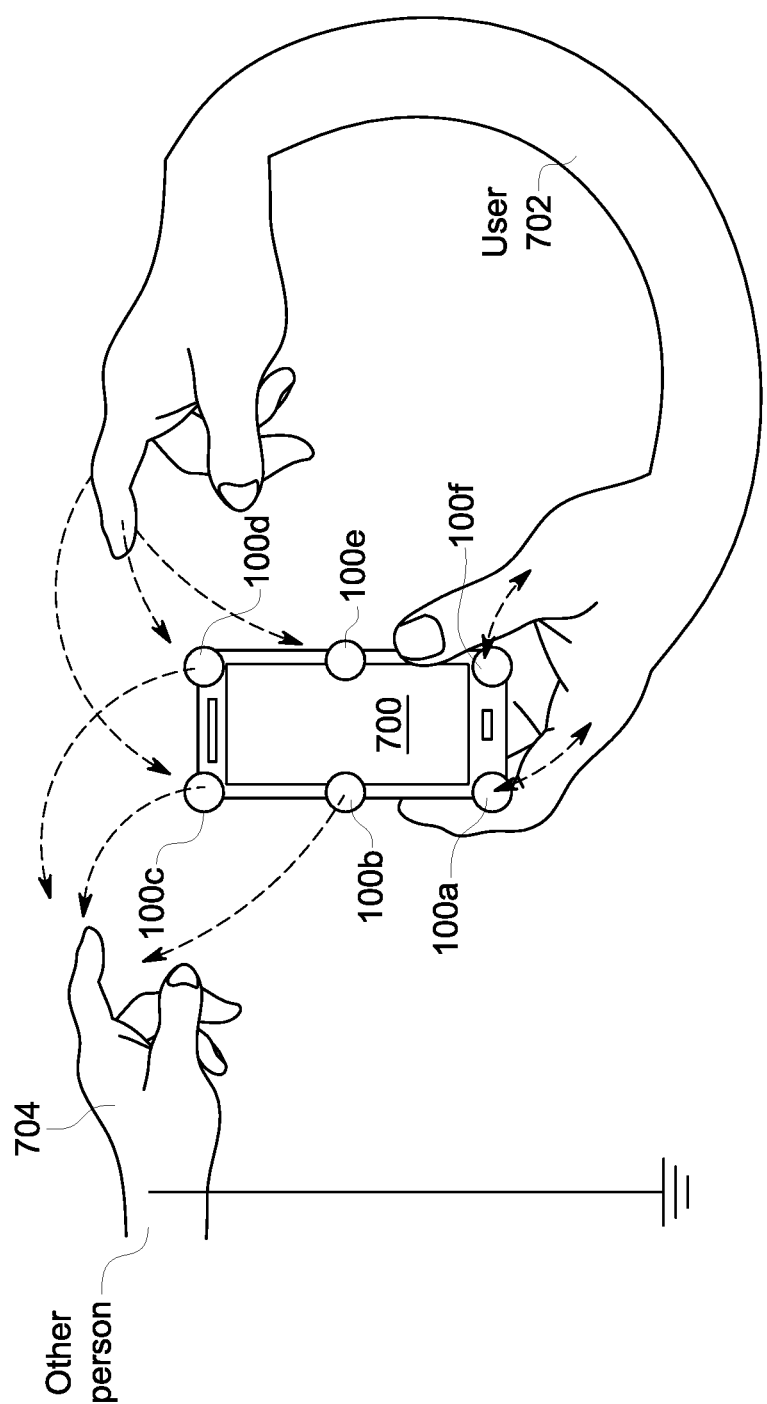
FIG. 6B illustrates a schematic diagram of plurality of smart sense units receiving multiple 3D gestures to operate smartphone in accordance with another preferred embodiment of the present invention.

FIG. 6B illustrates a schematic diagram of plurality of smart sense units 100a-100f receiving multiple 3D gestures to operate smartphone 700 in accordance with another preferred embodiment of the present invention. The plurality of smart sense units 100a-100f are attached on frame of the smartphone 700. The smart sense units 100a-100f detects the direction and gesture of approaching user 702.

The smart sense units 100a-100f measures result of the change in the electric field and direction of approach of the user 702 to operate the smartphone 700. An internal smart sensing master unit (not shown in FIG. 6b) identifies the gesture and identification information of the user 702.

Another user 704 approaches the smartphone 700 to perform operations and absorbs the electric field and thus changes the digital value. The baseliner and percenter negates the drift and ignore the change in the electric field created by the user 704. The earth's ground act as a common drain from the charges.

The smart sensing units 100a-100f are attached to the frame of the smartphone to allow one or more users to interact with hand gestures or bring objects (e.g. pawns, action figure, play items, stylus, pencil, pen etc.) close to or on the screen. The objects may further contain smart sensing units 100a-100f. Examples of operation of smartphone include but not limited to on-off, rotate screen, start functions, read and write from the object, retrieving any information from/to the object etc.

The present invention may be used for multiple applications such as:

a) Cars/Vehicles: Drivers are allowed to remotely operate control elements by preventing passengers from doing so (e.g. releasing the eBrake). Driver and passenger may also share a (touch) display screen or switches for different purposes (e.g. directing air streams, navigation during driving may be disabled for the driver but enabled for the passenger).

The smart sense units are attached to various parts of the vehicle to protect passengers from being incarcerated from (electromechanical) closing parts (windows, doors, roofs) if they approach a (danger) zone. Outside the zone, the passengers are allowed to operate (open or close) the vehicle's parts using gestures.

Smart sense units 100 may be attached to (car-/boat-/plane-) seats to sense movements from passengers or monitor head movement from drivers (e.g. check if they look into a mirror). Further, the smart sense units are attached to SmartPhone to prevent a driver from texting while driving the vehicle (a big problem with younger people, and ride share drivers causing high accident and death rate).

b) Homes/Rooms: The present invention allows residents to control the environment or home appliances with gestures. The smart sense units 100 are embedded in the floor/sealing and/or in furniture (even in plants) to support "aging@home" or assistant living. Occupants/visitors movements and action may be monitored e.g. at trade shows or shopping scenarios. Workers movements may also be monitored during their work for quality and safety reasons, without touching (possible dangerous) machine parts.

c) SmartDevices: The present invention allows users to remotely or contactless operate smart phones, tablets, eReaders, SmartGlasses or (AR) game controllers attached with smart sense units 100. Smartwatches touch screen seem too small for extended touch operation, 3D gestures significantly enhance the features of any (existing and future) electronic device.

d) Robotics: It is apparent to control robots (automats, machines) with gestures. Workers become cooperative and safely work with robots. Moving machines or people and their actions may be identified, usage of tools and assembly specifications may be recorded.

It should be understood, of course, that the foregoing relates to exemplary embodiments of the invention and that modifications may be made without departing from the spirit and scope of the invention as set forth in the following claims.

The invention claimed is:

1. A system for allowing users to capacitively interact with objects using gestures in an environment, the system comprising:
   a smart sense unit to communicate gesture information received from a user, further the smart sense unit sends identification information related to at least one of the user and an object; and
   a smart sensing master unit capacitively coupled to the smart sense unit for identifying the received gesture information and the identification information to operate the object;
   wherein the smart sensing master unit comprises:
      a generator for generating a controllable frequency at a constant voltage level;
      a resonator for creating sine waves from the controllable frequency, wherein the resonator further increases the voltage level, further the resonator filters and forks the gesture information and the identification information;
      a first emitting conductive surface converts the controllable frequency into an alternating electric field, further the first emitting conductive surface emits a sine waves alternating electric field;
      a controller to convert the gesture information received from the smart sense unit into functions for interacting with the object, further the controller controls the smart sense unit and identifies a location of the user while interacting with the object; and
      an interface to communicate the gesture information and the identification information to interact with the object over a communication network; and
   wherein the smart sense unit comprises:
      a mirror electrode capacitively coupled with the first emitting conductive surface to receive the sine waves alternating electric field;
      a rectifier converts charges received from the mirror electrode into direct current (DC) energy;
      a buffer smoothes ripples and stores the DC energy and clamps back against over-voltage utilizing the rectifier;
      a Schmitt trigger turns the sine waves received from the mirror electrode into a digital usable rectangle signal;
      a data separator unit extracts a clock and modulated data from the rectangle signal;
      a counter synchronized by the data separator unit, further the counter creates time slots and clocks;
      an impedance sensing sub-circuit measures changes in an electric field caused by the user and the object, further the impedance sensing sub-circuit is activated by a counter event from the counter to convert the measurement result of the change in the electric field into a digital value;
      a memory unit to store the digital value;
      an identification unit having an identifier value as a unique identifier (ID) for identifying a location of the object and the location of the user;
      a digital comparator unit compares the counter event received from the counter with the unique ID received from the identification unit to release a matching signal on identifying a match between the counter event and the unique ID;
      a serial modulator receives the digital value from the memory unit and the unique ID from the identification unit on receiving the matching signal from the digital comparator unit, wherein the serial modulator modulates the unique ID and the digital value with a clock derived from the counter to create a data telegram;
      an electronic switch connected to the serial modulator to change an impedance of the electric field with the data telegram; and
      a floating electrode coupled with the mirror electrode to complete an electronic circuit against ground;

further wherein the controller identifies the gesture and the identification information to interact with the object on receiving the impedance changes forked by the resonator.

2. The system according to claim 1 wherein the smart sense unit further comprises a baseliner to store a baseline value to compare the digital value received from the impedance sensing sub-circuit, further the baseliner adjusts the baseline value and the digital value and migrates to the digital value in the memory unit to compensate for drift and to ignore obstacles.

3. The system according to claim 1 wherein the smart sense unit further comprises a percenter to normalize the digital values received from the impedance sensing sub-circuit into a percentage from a given maximum or minimum value for self-calibrating.

4. The system according to claim 1, wherein the smart sense unit further comprises a feedback unit to generate feedback signals on receiving a command from the controller via the data separator unit.

5. The system according to claim 4 wherein the smart sense unit further comprises a switch matrix to operate the feedback unit.

6. The system according to claim 1 wherein the mirror electrode and the first emitting conductive surface comprises an organic material.

7. A system for allowing multiple users to capacitively interact with objects using gestures in an environment, the system comprising:
   a plurality of smart sense units, wherein each smart sense unit communicates gesture information received from a user, further the smart sense unit sends identification information related to at least one of the user and an object; and
   one or more smart sensing master units, wherein each smart sensing master unit is capacitively coupled to a smart sense unit for identifying the received gesture information and the identification information to operate the object;
   wherein the smart sensing master unit comprises:
      a generator for generating a controllable frequency at a constant voltage level;
      a resonator for creating sine waves from the controllable frequency, wherein the resonator further increases the voltage level, further the resonator filters and forks the gesture information and the identification information;
      a first emitting conductive surface converts the controllable frequency into an alternating electric field, further the first emitting conductive surface emits a sine waves alternating electric field;
      a controller to convert the gesture information received from the smart sense unit into functions for interacting with the object, further the controller controls the smart sense unit and identifies a location of the user while interacting with the object;
      an interface to communicate the gesture information and the identification information to interact with the object over a communication network; and
   wherein the smart sense unit comprises:
      a mirror electrode capacitively coupled with the first emitting conductive surface to receive the sine waves alternating electric field;
      a rectifier converts charges received from the mirror electrode into direct current (DC) energy;
      a buffer smoothes ripples and stores the DC energy and clamps back against over-voltage utilizing the rectifier;
      a Schmitt trigger turns the sine waves received from the mirror electrode into a digital usable rectangle signal;
      a data separator unit extracts a clock and modulated data from the rectangle signal;
      a counter synchronized by the data separator unit, further the counter creates time slots and clocks;
      an impedance sensing sub-circuit measures changes in an electric field caused by the user and the object, further the impedance sensing sub-circuit is activated by a counter event from the counter to convert the measurement result of the change in the electric field into a digital value;
      a memory unit to store the digital value;
      an identification unit having an identifier value as a unique identifier (ID) for identifying a location of the object and the location of the user;
      a digital comparator unit compares the counter event received from the counter with the unique ID received from the identification unit to release a matching signal on identifying a match between the counter event and the unique ID;
      a serial modulator receives the digital value from the memory unit and the unique ID from the identification unit on receiving the matching signal from the digital comparator unit, wherein the serial modulator modulates the unique ID and the digital value with a clock derived from the counter to create a data telegram;
      an electronic switch connected to the serial modulator to change an impedance of the electric field with the data telegram; and
      a floating electrode coupled with the mirror electrode to complete an electronic circuit against ground;
   further wherein the controller identifies the gesture and the identification information to interact with the object on receiving the impedance changes forked by the resonator.

8. The system according to claim 7 wherein the smart sense unit further comprises a baseliner to store a baseline value to compare the digital value received from the impedance sensing sub-circuit, further the baseliner adjusts the baseline value and the digital value and migrates to the digital value in the memory unit to compensate for drift and to ignore obstacles.

9. The system according to claim 7 wherein the smart sense unit further comprises a percenter to normalize the digital values received from the impedance sensing sub-circuit into a percentage from a given maximum or minimum value for self-calibrating.

10. The system according to claim 7 wherein the smart sense unit further comprises a feedback unit to generate feedback signals on receiving a command from the controller via the data separator unit.

11. The system according to claim 10 wherein the smart sense unit further comprises a switch matrix to operate the feedback unit.

12. The system according to claim 7 wherein the mirror electrode and the first emitting conductive surface comprises an organic material.

13. A system for allowing multiple users to capacitively interact with objects using gestures in an environment, the environment containing plants, the system comprising:

a plurality of smart sense units, wherein each smart sense unit communicates gesture information received from a user, further the smart sense unit sends identification information related to at least one of the user and an object; and one or more smart sensing master units, wherein each smart sensing master unit is capacitively coupled to a smart sense unit for identifying the received gesture information and the identification information to operate the object;

wherein the smart sensing master unit comprises:

a generator for generating a controllable frequency at a constant voltage level;

a resonator for creating sine waves from the controllable frequency, wherein the resonator further increases the voltage level, further the resonator filters and forks the gesture information and the identification information;

a first emitting conductive surface converts the controllable frequency into an alternating electric field, wherein the alternating electric field is spread over and emitted via the plants;

a controller to convert the gesture information received from the smart sense unit into functions for interacting with the object, further the controller controls the smart sense unit and identifies a location of the user while interacting with the object; and an interface to communicate the gesture information and the identification information to interact with the object over a communication network;

wherein the smart sense unit comprises:

a mirror electrode receives the alternating electric field emitted via the plants;

a rectifier converts charges received over the plants into direct current (DC) energy;

a buffer smoothes ripples and stores the DC energy and clamps back against over-voltage utilizing the rectifier;

a Schmitt trigger turns the sine waves received from the resonator via the plants into a digital usable rectangle signal;

a data separator unit extracts a clock and modulated data from the rectangle signal;

a counter synchronized by the data separator unit, further the counter creates time slots and clocks;

an impedance sensing sub-circuit measures changes in an electric field caused by the user and the object, further the impedance sensing sub-circuit is activated by a counter event from the counter to convert the measurement result of the change in the electric field into a digital value;

a memory unit to store the digital value;

an identification unit having an identifier value as a unique identifier (ID) for identifying a location of the object and the location of the user;

a digital comparator unit compares the counter event received from the counter with the unique ID received from the identification unit to release a matching signal on identifying a match between the counter event and the unique ID;

a serial modulator receives the digital value from the memory unit and the unique ID from the identification unit on receiving the matching signal from the digital comparator unit, wherein the serial modulator modulates the unique ID and the digital value with a clock derived from the counter to create a data telegram;

an electronic switch connected to the serial modulator to change an impedance of the electric field with the data telegram; and a floating electrode coupled with the mirror electrode to complete an electronic circuit against ground;

further wherein the controller identifies the gesture and the identification information to interact with the object on receiving the impedance changes forked by the resonator.

14. The system according to claim 13 wherein the smart sense unit further comprises a baseliner to store a baseline value to compare the digital value received from the impedance sensing sub-circuit, further the baseliner adjusts the baseline value and the digital value and migrates to the digital value in the memory unit to compensate for drift and to ignore obstacles.

15. The system according to claim 14 wherein the smart sense unit further comprising a percenter to normalize the digital values received from the impedance sensing sub-circuit into a percentage from a given maximum or minimum value for self-calibrating.

16. The system according to claim 13 wherein the smart sense unit further comprises a feedback unit to generate feedback signals on receiving a command from the controller via the data separator unit.

17. The system according to claim 16 wherein the smart sense unit further comprises a switch matrix to operate the feedback unit.

* * * * *